US008071889B2

(12) United States Patent
Liu (10) Patent No.: US 8,071,889 B2
(45) Date of Patent: Dec. 6, 2011

(54) ELECTRONIC DEVICE WITH EMI SCREEN AND PACKING PROCESS THEREOF

(76) Inventor: Chien-Hung Liu, Taoyuan Hsien (TW)

( * ) Notice: Subject to any disclaimer, the term of this patent is extended or adjusted under 35 U.S.C. 154(b) by 1235 days.

(21) Appl. No.: 11/706,411

(22) Filed: Feb. 15, 2007

(65) Prior Publication Data

US 2008/0007934 A1 Jan. 10, 2008

(30) Foreign Application Priority Data

May 19, 2006 (TW) .............................. 95117834 A (51) Int. Cl.
*H05K 1/11* (2006.01)
(52) U.S. Cl. .......................... 174/262; 361/792; 257/678
(58) Field of Classification Search .................. 257/678, 257/773; 174/262–266; 361/792–795
See application file for complete search history.

(56) References Cited

U.S. PATENT DOCUMENTS 6,601,293 B1 * 8/2003 Glenn .............................. 29/841

* cited by examiner

*Primary Examiner* — Jeremy Norris
(74) *Attorney, Agent, or Firm* — Liu & Liu (57) ABSTRACT

An electronic device with EMI screen and packaging process thereof to provide even active EMI prevention means includes adhesion of a transit substrate to a soldering surface of the electronic device, a protection circuit layer functioning as EMI screen being paved on the bottom of the transit substrate; a packaging circuit layer being laid; protection circuit layer and the transit substrate as well as the packaging and protection circuit layers being segregated with an insulation material; and solder balls provided with electric continuity to the protection circuit layer and the packaging circuit layer being respectively implanted as soldering points respectively for EMI grounding and linkage between the electronic device and a printed circuit.

25 Claims, 14 Drawing Sheets

ELECTRONIC DEVICE WITH EMI SCREEN AND PACKING PROCESS THEREOF

BACKGROUND OF THE INVENTION (a) Field of the Invention

The present invention is related to a packaging technology of electronic device, and more particularly to an electronic device provided with electro magnetic interference (EMI) protection circuit and packaging technology thereof.

(b) Description of the Prior Art

In a design of digital circuitry, conduction wire and circuit board radiate electromagnetic waves to affect layout of circuitry and wire in the perimeter of the circuit and any conductor that may transmit these electro magnetic (EM) waves, a phenomenon known as EMI. So far there is no way to absolutely exclude EMI; but hazards from EMI may be minimized by good circuit design and wiring technique for the circuit board.

For example, grounding, screening, and filtering methods may be employed to complete EM compatibility design. Wherein, the grounding method involves leading interference signals into a grounding end; screening, a screen material to resist EMI; and filtering, an EMI filter to stop interference signals.

All these three EMI preventive methods are the most common practices used for all electronic devices to prevent EMI. However, angling at the electronic device (electric installation), the means to prevent EMI is comparatively passive since its EMI preventive strategy must rely upon its EMI protection mechanism. Furthermore, EMI is essentially originated from excessive distribution density of electronic devices or from HF circuit. As the development of electronic products is heading for HF and smaller size; whether an electronic product is provided with sufficient space to build EMI protection mechanism justifies further discussion.

SUMMARY OF THE INVENTION

The primary purpose of the present invention is to provide an electronic device provided with an EMI protection circuit and packaging technique thereof thus to give the electronic device a more active means to prevent EMI while favoring the development of the electronic device applied products in heading for HF and smaller size.

To achieve the purpose, a transit substrate is adhered to a soldering surface of the electronic device; a protection circuit layer functioning as an EMI screen is paved on the bottom of the transit substrate; a packaging circuit layer is laid; at where between the protection circuit layer and the transit substrate as well as where between the packaging circuit layer and the protection circuit layer are respectively segregated with an insulation material; and finally a solder ball with continuity to the packaging circuit layer is planted at a pre-designated location on the bottom of the transit substrate to serve as a soldering point to connect the electronic device and a printed circuit board thus to complete for the electronic device an even more active means to prevent EMI.

DETAILED DESCRIPTION OF THE PREFERRED EMBODIMENTS

Figure 1:
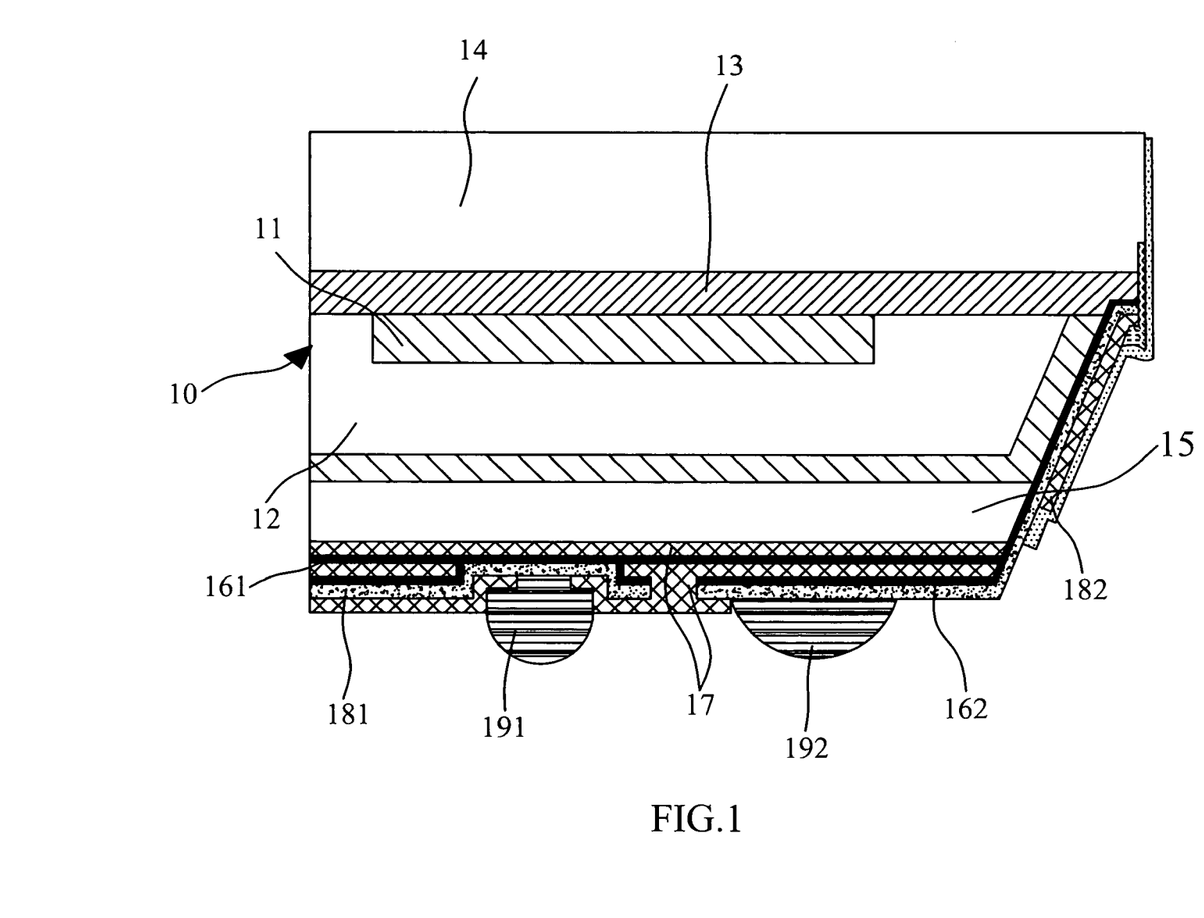
FIG. 1 is a sectional view of an electronic device of the present invention.

Referring to FIG. 1 for a basic configuration of an electronic device provided with EMI screen and its packaging process of the present invention, an electronic device 10 comprised of a wafer 12 and associate packaging unit 11 is the principal part of operating and is built on a substrate 14 (e.g., an insulation substrate) with an insulation plastic material 13; a transit substrate 15 is adhered to a soldering surface in opposite to the substrate 14 of the electronic device 10; a protection circuit layer 162 serving as an EMI screen is paved on the bottom of the transit substrate 15; a packaging circuit layer 161 is provided; and at where between the protection circuit layer 162 and the transit substrate 15 as well as where between the packaging circuit layer 161 and the protection circuit layer 162 are respectively segregated by means of an insulation material 17. A solder ball 192 provided with electric continuity with the protection circuit layer 162 to serve as a soldering point for EMI grounding and a solder ball 191 provided with electric continuity to the packaging circuit layer 161 serving as soldering point for connection between the electronic device 10 and a printed circuit board are implanted on pre-designated locations on the bottom of the transit substrate 15. Accordingly, the electronic device provided with an EMI protection circuit is given a more active means to prevent EMI while facilitating the development of an electronic product adapted with the electronic device 10 to head for HF and smaller size.

FIGS. 2 through 13 illustrate a packaging process for the electronic device 10 including steps involving adhesion of transit substrate, primary insulation material construction, packaging circuit layer construction, secondary insulation material construction, packaging circuit margin cutting, protection circuit layer construction, metallization, device margin segregation, implantation of solder ball, cutting into mold, and evaporation in sequence.

Figure 2:
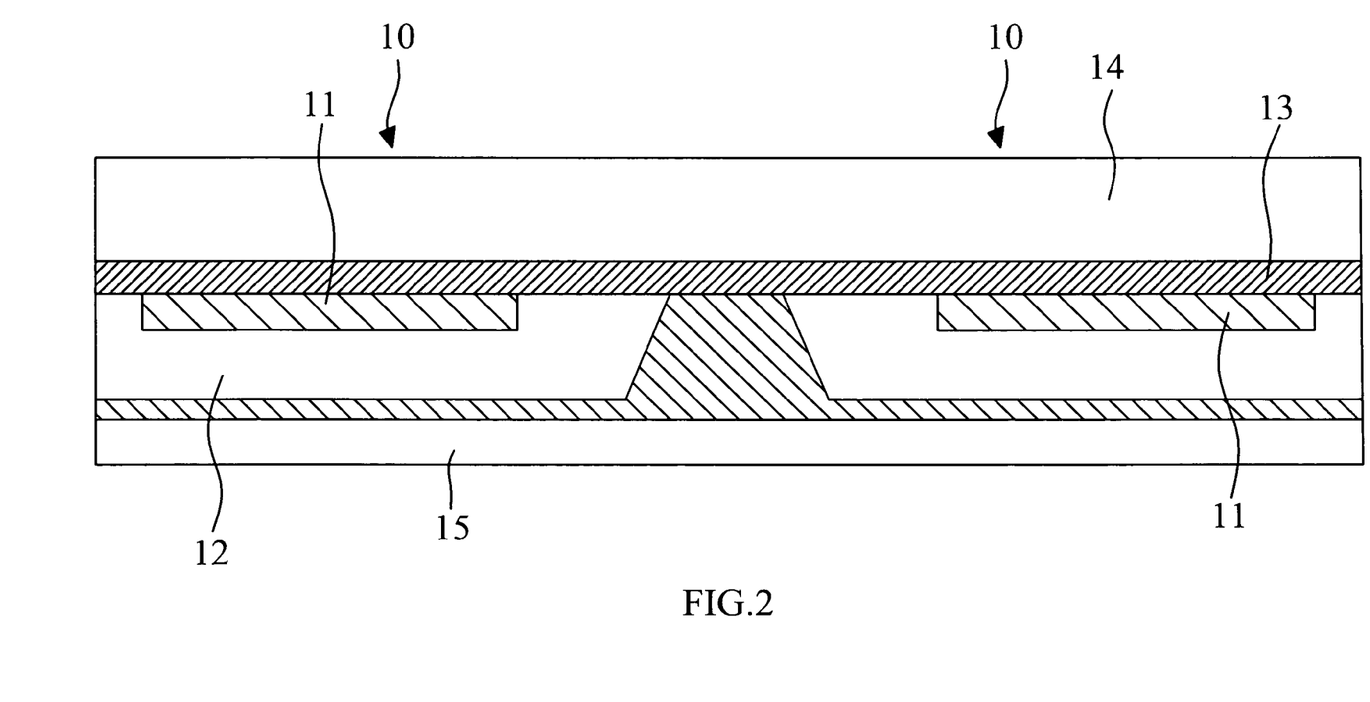
FIG. 2 is a schematic view showing a process of adhesion of a transit substrate in the present invention.

As illustrated in FIG. 2 for the process of adhesion of transit substrate, the transit substrate 15 is adhered to a soldering surface in opposite to the substrate 14; multiple electronic devices 10 are provided on the same substrate 14 to facilitate synchronous processing on those electronic devices 10.

Figure 3:
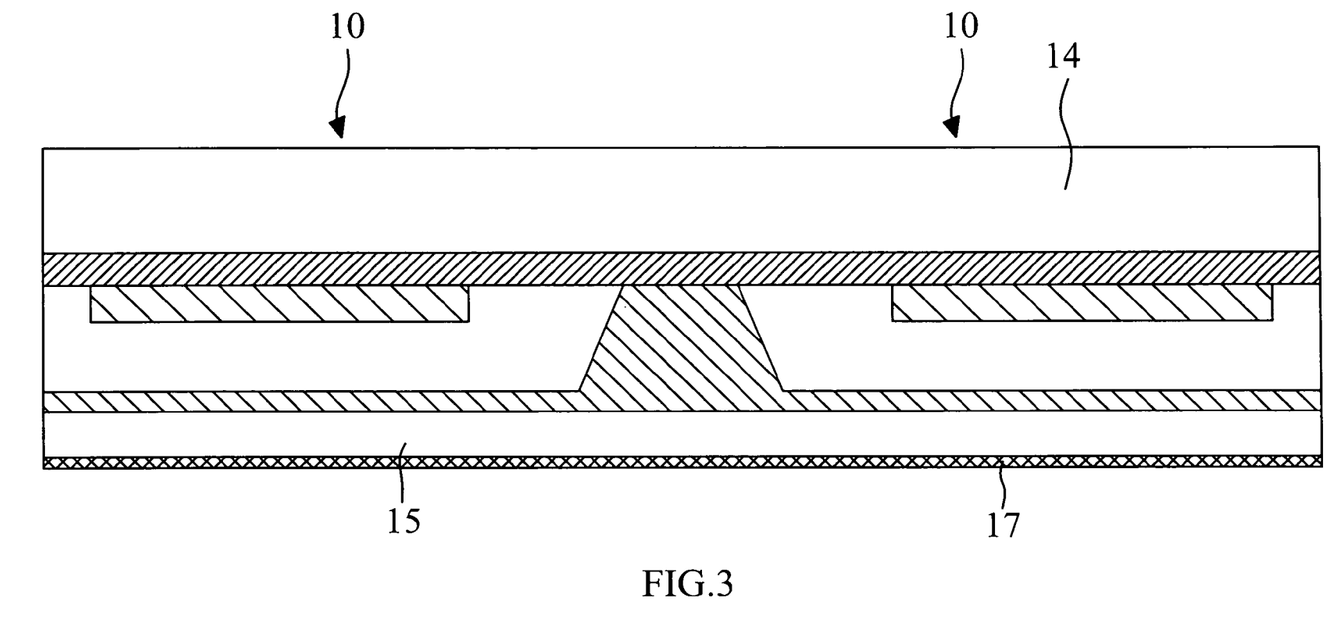
FIG. 3 is a schematic view showing a process of creating a primary insulation material in the present invention.

The insulation material 17 related to a photo resist or epoxy is applied on the bottom of the transit substrate 15 and properly flattened to complete construction of the primary insulation material in a step as illustrated in FIG. 3.

Figure 4:
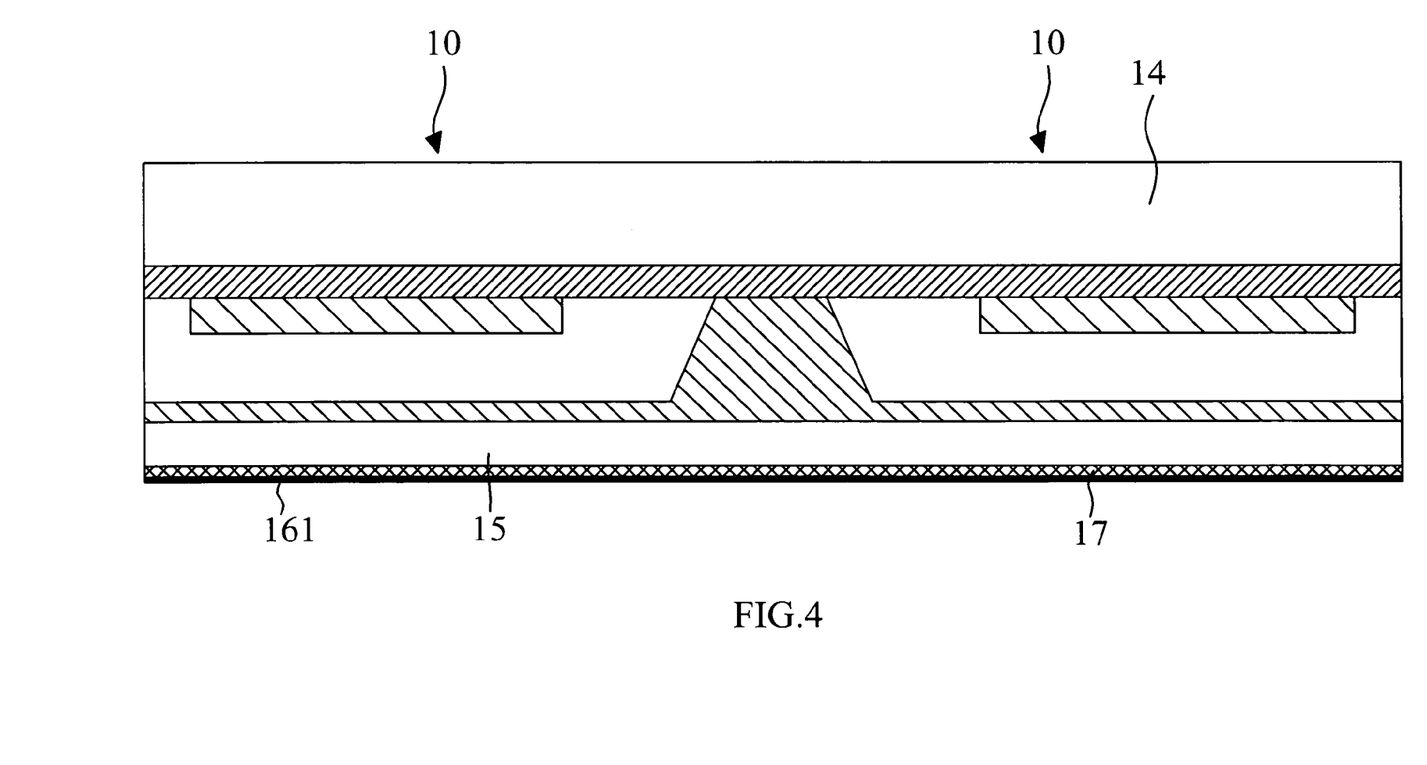
FIG. 4 is a schematic view showing a process of building up a packaging circuit layer in the present invention.

A step of construction of packaging circuit layer as illustrated in FIG. 4 requires coating of a course on the insulation material 17 serving as the metal material for the packaging circuit layer 161.

Figure 5:
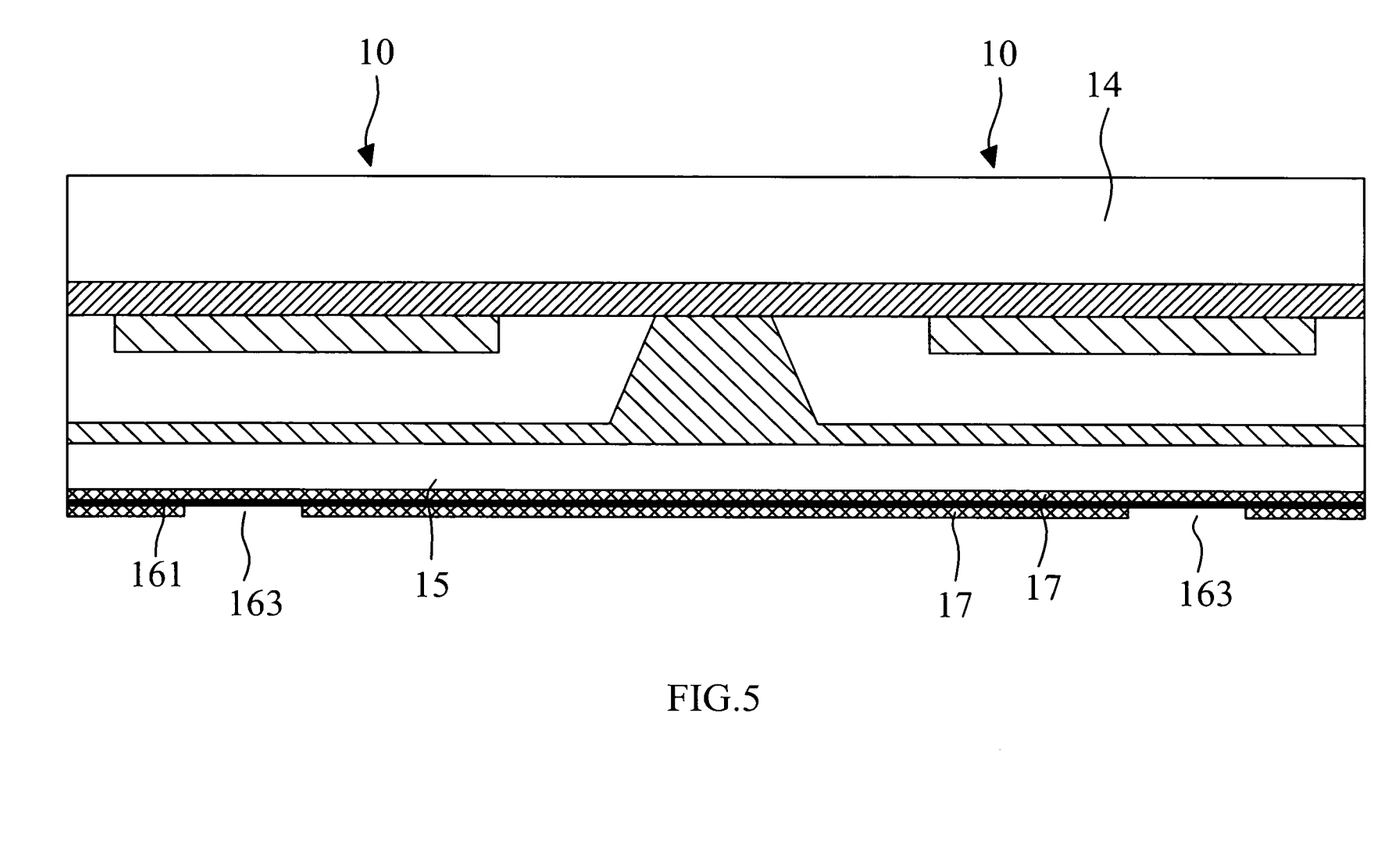
FIG. 5 is a schematic view showing a process of creating a secondary insulation material in the present invention.

As illustrated in FIG. 5, a step of secondary insulation material has the insulation material 17 related to the same photo resist or epoxy to be applied on the bottom of the packaging circuit layer 161 to become a passage 163 for providing electric continuity between the packaging circuit layer 161 and a solder ball through exposure and development processes.

Figure 6:
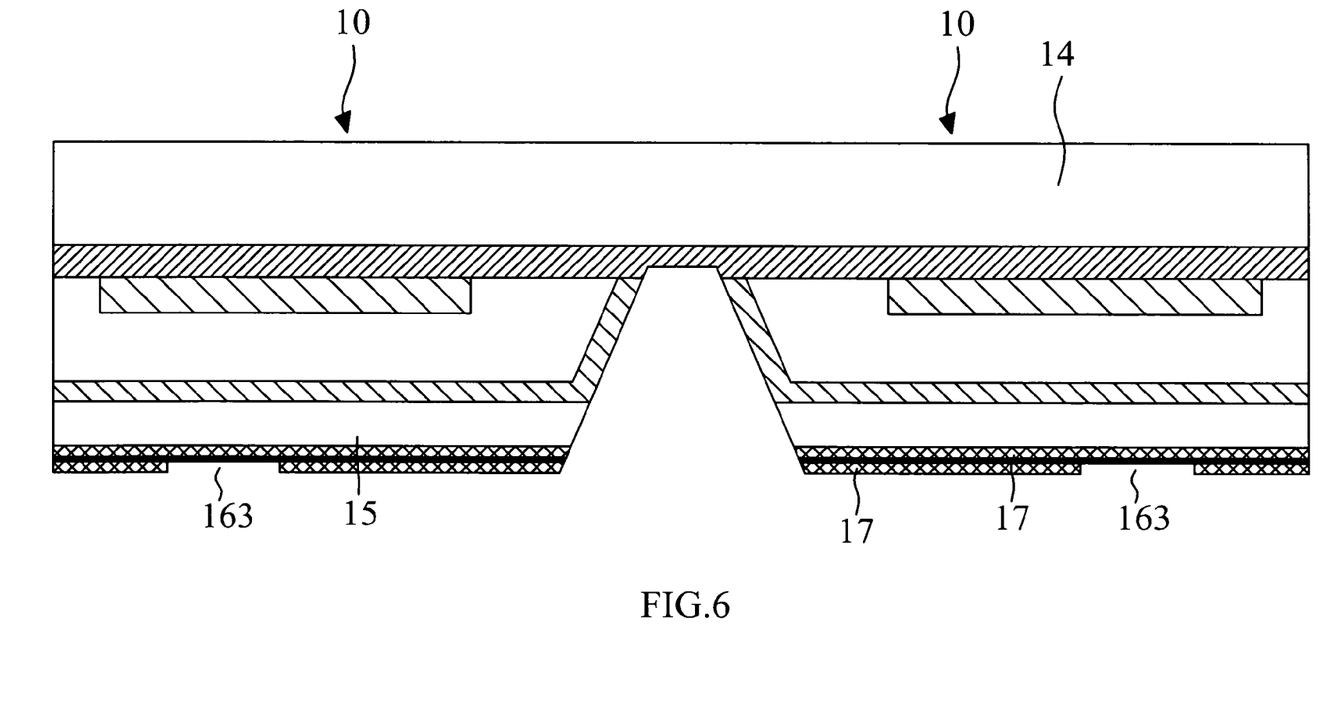
FIG. 6 is a schematic view showing a process of cutting edge of the packaging circuit layer in the present invention.

In a step of margin cutting of the packaging circuit layer as illustrated in FIG. 6, those portions of the transit substrate 15 and the insulation material 17 connecting to each electronic device 10 are removed to expose margin of the packaging circuit layer 161 of each electronic device 10; if and when required, the margin of the packaging circuit layer 161 may serve the passage to connect each electronic device 10; and this step is omitted when only one electronic device 10 is packaged.

Figure 7:
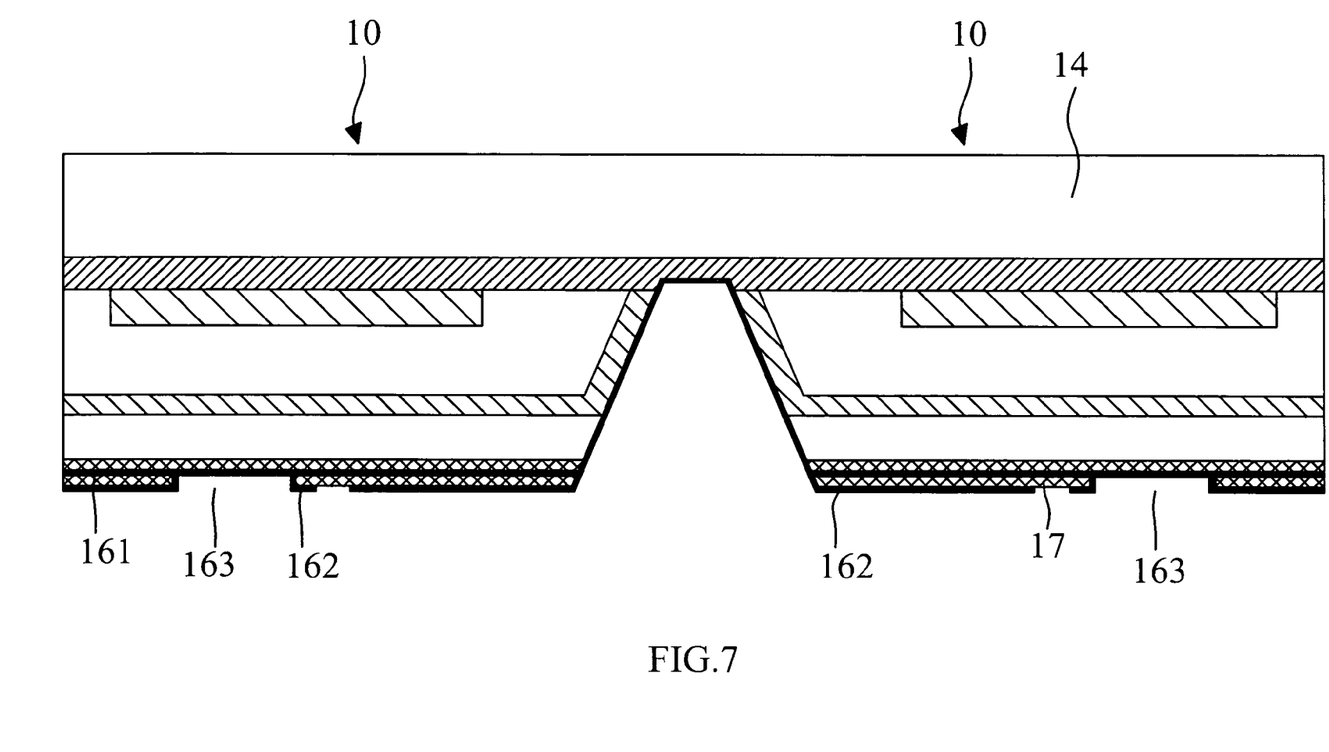
FIG. 7 is a schematic view showing a process of building up a protection circuit layer in the present invention.

FIG. 7 shows a step for construction of protection circuit layer 162, an operation circuit for the electronic device 10 is laid on the secondary insulation material 17 to provide the protection circuit layer 162 with the passage 163 for the protection circuit layer 162 to achieve electric continuity with the solder ball; and the protection circuit layer 162 may be linked to the packaging circuit layer 161 by means of the margin of the packaging circuit layer 161.

Figure 8:
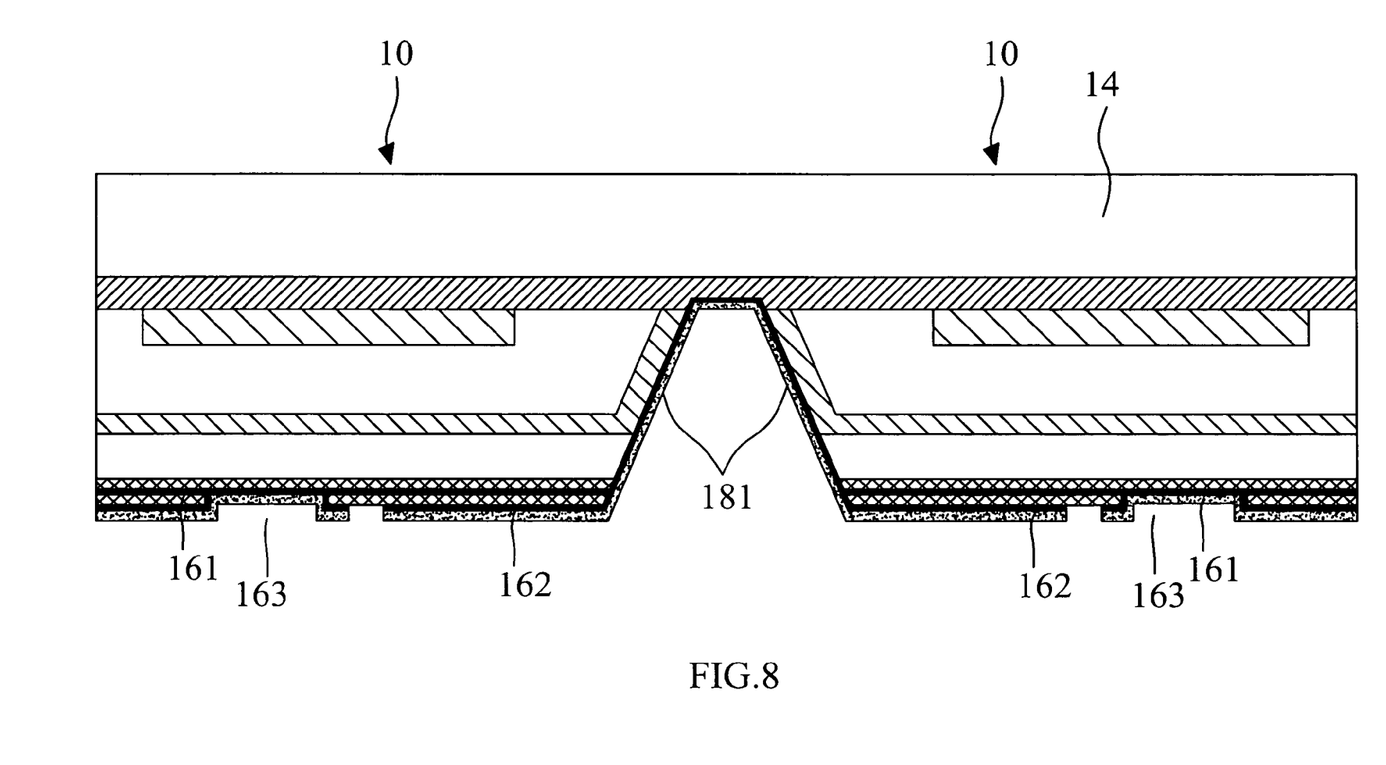
FIG. 8 is a schematic view showing a metallization process in the present invention.

The packaging circuit layer 161, the protection circuit layer 162, and the passage 163 are metallized 181 in a step of metallization as illustrated in FIG. 8.

Figure 9:
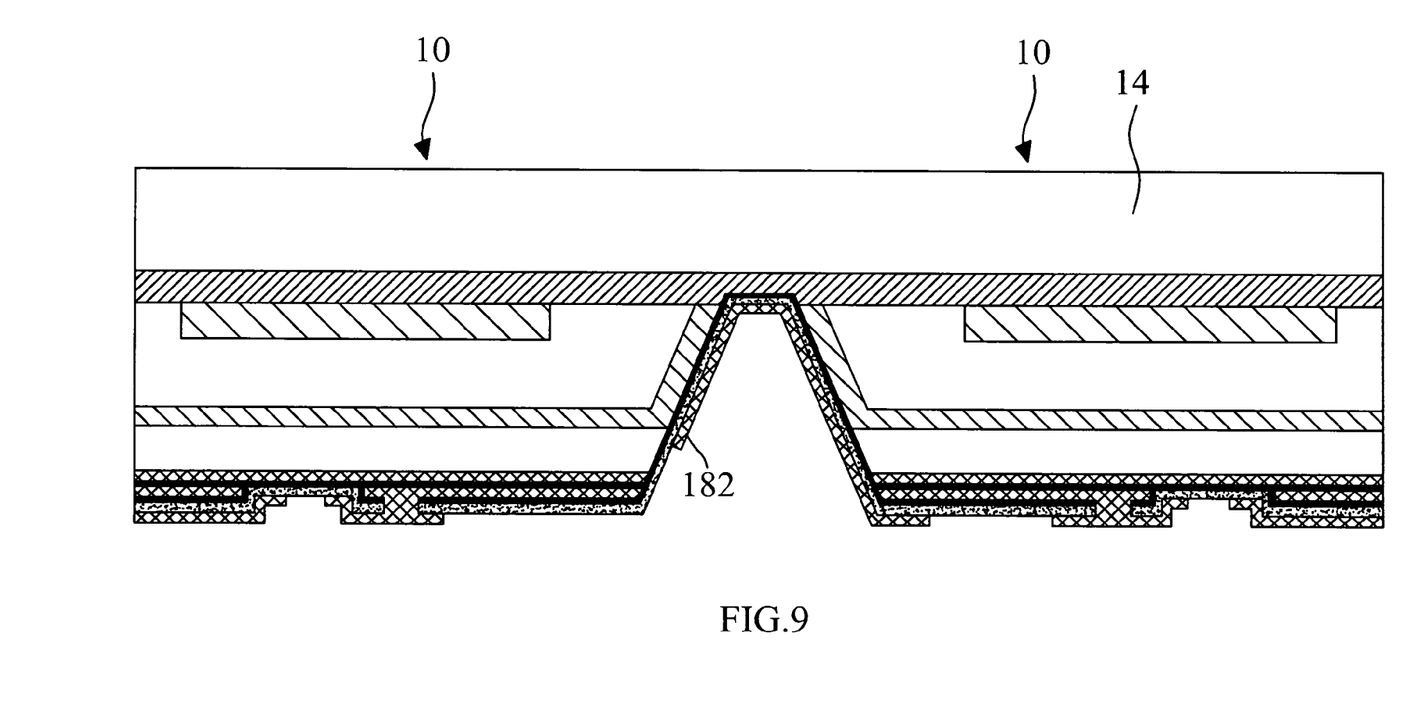
FIGS. 9, 10, and 11 are schematic views showing a process of segregation on the margins of devices in the present invention.
Figure 10:
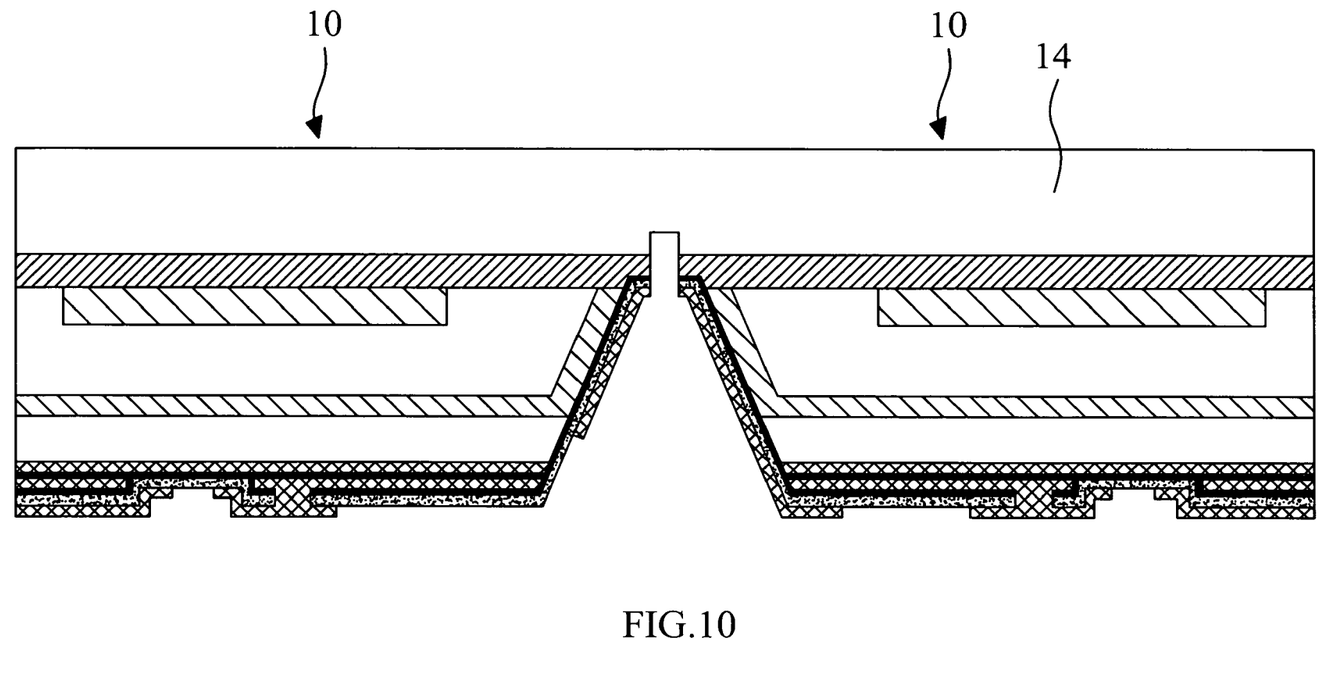
Figure 11:
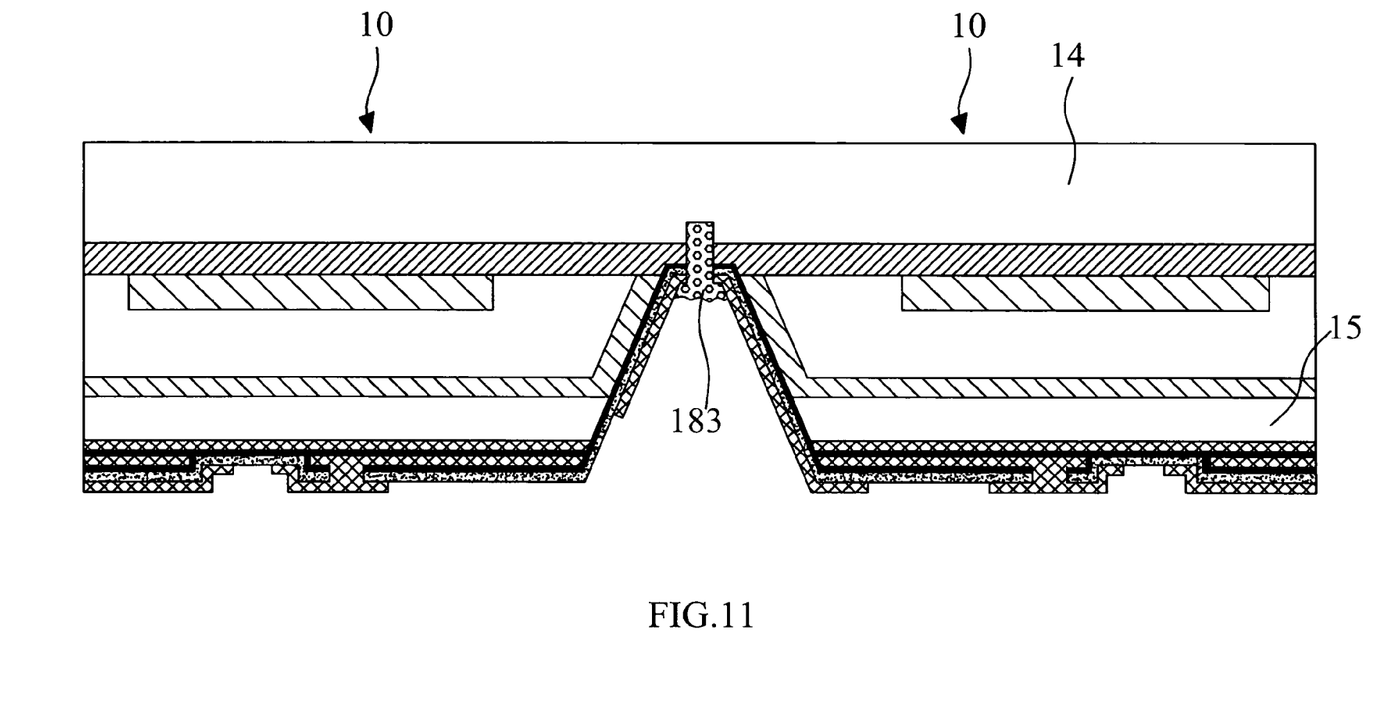

As illustrated in FIGS. 9 and 10 for a step to segregate margin of device, a solder mask 182 is applied to margin of each electronic device so to mask a portion of the circuit layer exposed for metallization as illustrated in FIG. 9; a portion of each electronic 10 to connect the substrate 14 is provided with a cutting line as illustrated in FIG. 10; and a glue material 183 is then filled into the grain as illustrated in FIG. 11 to prevent seepage of foreign materials into the electronic device 10. This step is skipped when only one electronic device 10 is packaged.

Figure 12:
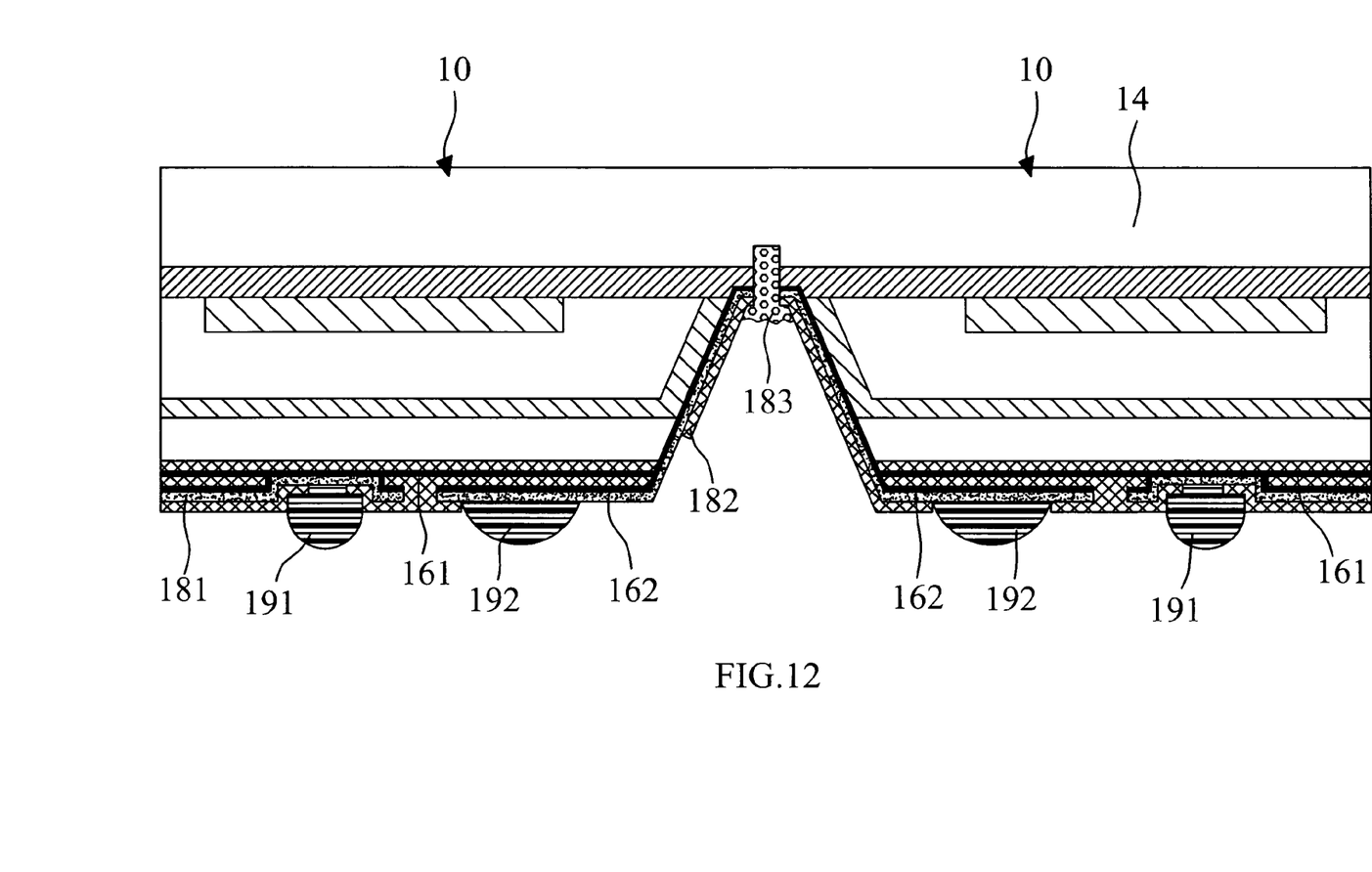
FIG. 12 is a schematic view showing a process of implantation of solder ball in the present invention.

Now referring to FIG. 12 for implantation of solder ball, a solder ball 192 provided with electric continuity to the protection circuit layer 162 serving as a soldering point for EMI grounding, and another solder ball 191 provided with electric continuity to the packaging circuit layer 161 serving as a soldering point to connect the electronic device 10 and the printed circuit board are implanted on pre-designated locations on the bottom of the transit substrate 15 of the electronic device 10.

Figure 13:
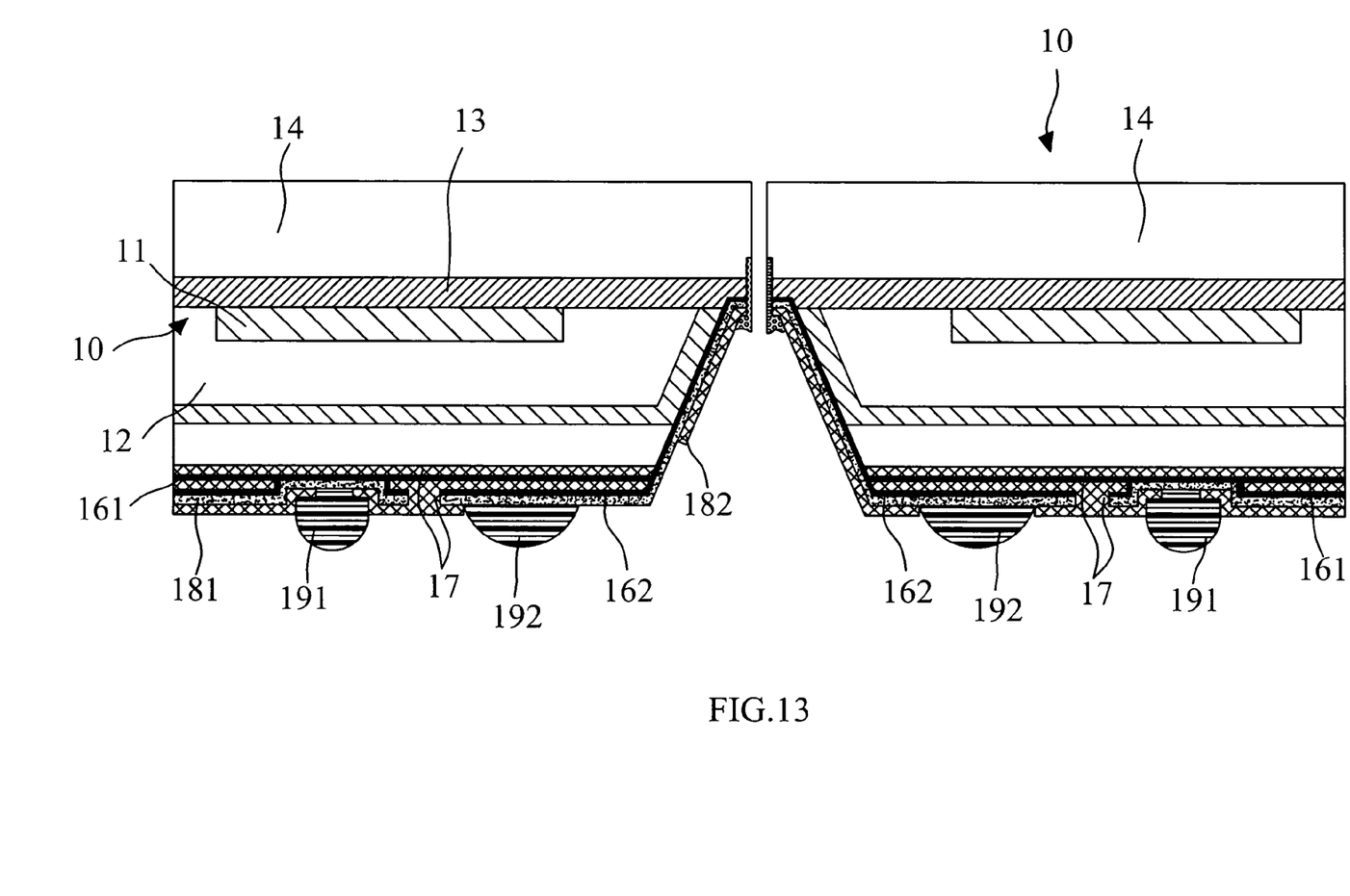
FIG. 13 is a schematic view showing a cutting of molding in the present invention.

Finally, each electronic device 10 becomes an integrated device by cutting any portion of the substrate 14 that connects any two abutted electronic devices 10 as illustrated in FIG. 13 for a mold cutting step. This step may be omitted if the electronic device 10 is packaged alone.

Figure 14:
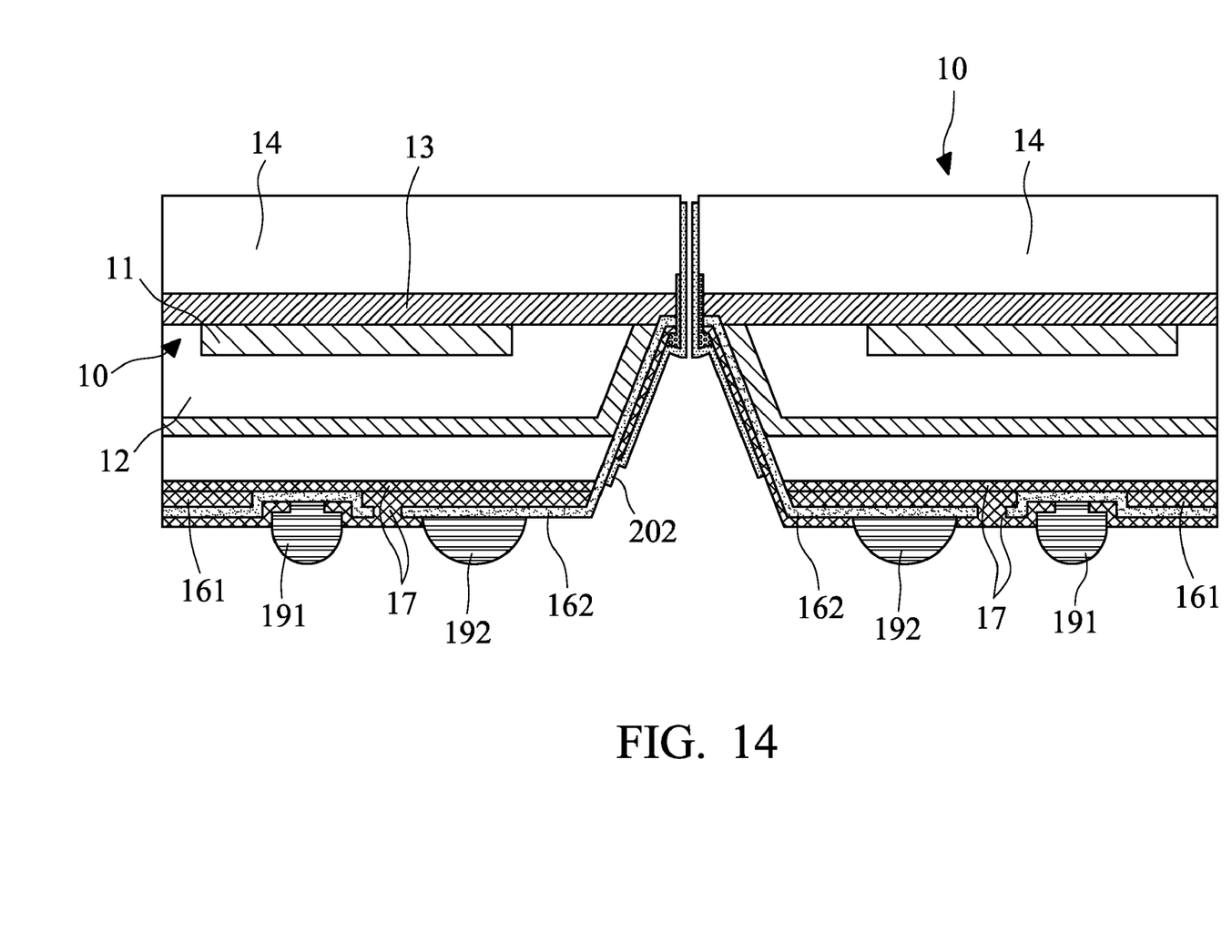
FIG. 14 is a schematic view showing an evaporation process of the present invention.

Furthermore, an evaporation step as illustrated in FIG. 14 may be provided as an auxiliary process to upgrade EMI prevention performance by soldering tin or copper 202 to the soldering surface of the electronic device 10 that is sufficient to lead out excessive current to reinforce EMI preventive efficacy of the electronic device 10.

The prevent invention provides an electronic device with EMI protection circuit and packaging technology thereof for giving an even more active means to prevent EMI thus to facilitate development of the electronic device applied electronic products to head for HF and smaller size, and this patent application is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. An electronic device packaging, comprising:
   an electronic device;
   a packaging circuit layer below the lower surface of the electronic device;
   a transit substrate having a top surface, a lower surface, and a sidewall, wherein the electronic device is above the transit substrate, and the packaging circuit layer is below the transit substrate;
   a protection circuit layer separated from the packaging circuit layer by an insulation material;
   at least a first connection electrically connected to the protection circuit layer and serving as a soldering point for EMI grounding; and
   at least a second connection electrically connected to the packaging circuit layer.

2. The electronic device packaging as claimed in claim 1, wherein the protection circuit layer serves as an EMI screen.

3. The electronic device packaging as claimed in claim 1, wherein the packaging circuit layer extends to vertically below the lower surface of the electronic device.

4. The electronic device packaging as claimed in claim 1, wherein the packaging circuit layer is electrically connected to the electronic device.

5. An electronic device packaging, comprising:
   an electronic device;
   a packaging circuit layer below the lower surface of the electronic device;
   a protection circuit layer separated from the packaging circuit layer by an insulation material;
   a transit substrate having a top surface, a lower surface, and a sidewall, wherein the electronic device is above the transit substrate;
   a substrate on a side of the electronic device opposite to the transit substrate;
   at least a first connection electrically connected to the protection circuit layer and serving as a soldering point for EMI grounding; and
   at least a second connection electrically connected to the packaging circuit layer.

6. The electronic device packaging as claimed in claim 1, wherein the protection circuit layer extends along a sidewall of the electronic device.

7. The electronic device packaging as claimed in claim 6, wherein the first connection and the second connection comprise solder balls.

8. The electronic device packaging as claimed in claim 6, wherein the first connection is electrically connected to the protection circuit layer by a first conductive layer.

9. An electronic device packaging, comprising:
   an electronic device;
   a packaging circuit layer below the lower surface of the electronic device;
   a protection circuit layer separated from the packaging circuit layer by an insulation material, wherein the protection circuit layer extends along a sidewall of the electronic device;
   at least a first connection electrically connected to the protection circuit layer and serving as a soldering point for EMI grounding, wherein the first connection is electrically connected to the protection circuit layer by a first conductive layer, and wherein the first conductive layer extends to overlay the protection circuit layer along the sidewall of the electronic device; and at least a second connection electrically connected to the packaging circuit layer.

10. The electronic device packaging as claimed in claim 9, further comprising a solder mask layer overlying a portion of the protection circuit layer and along the sidewall of the electronic device.

11. The electronic device packaging as claimed in claim 10, wherein a portion of the first conductive layer along the sidewall of the electronic device is not covered by the solder mask layer.

12. The electronic device packaging as claimed in claim 11, further comprising a conductive layer overlying a portion of the solder mask layer.

13. The electronic device packaging as claimed in claim 12, wherein the conductive layer extends to cover a portion of the first conductive layer overlying the sidewall of the electronic device.

14. The electronic device packaging as claimed in claim 9, wherein the second connection is electrically connected to the packaging circuit layer by a second conductive layer.

15. An electronic device packaging process, comprising:
providing an electronic device;
providing a packaging circuit layer below the lower surface of the electronic device;
providing a transit substrate having a top surface, a lower surface and a sidewall, wherein the electronic device is above the transit substrate, and the packaging circuit layer is below the transit substrate;
providing a protection circuit layer separated from the packaging circuit layer by an insulation material;
providing at least a first connection electrically connected to the protection circuit layer and serving as a soldering point for EMI grounding; and
providing at least a second connection electrically connected to the packaging circuit layer.

16. The electronic device packaging process as claimed in claim 15, wherein the protection circuit layer serves as an EMI screen.

17. The electronic device packaging process as claimed in claim 15, wherein the protection circuit layer extends along a sidewall of the electronic device.

18. The electronic device packaging process as claimed in claim 17, wherein the first connection is electrically connected to the protection circuit layer by a first conductive layer.

19. The electronic device packaging process as claimed in claim 15, wherein the packaging circuit layer is electrically connected to the electronic device.

20. An electronic device packaging process, comprising:
providing an electronic device;
providing a packaging circuit layer below the lower surface of the electronic device;
providing a protection circuit layer separated from the packaging circuit layer by an insulation material, wherein the protection circuit layer extends along a sidewall of the electronic device;
providing at least a first connection electrically connected to the protection circuit layer and serving as a soldering point for EMI grounding, wherein the first connection is electrically connected to the protection circuit layer by a first conductive layer, and wherein the first conductive layer extends to overlay the protection circuit layer along the sidewall of the electronic device; and
providing at least a second connection electrically connected to the packaging circuit layer.

21. An electronic device packaging, comprising:
an electronic device;
a packaging circuit layer below the lower surface of the electronic device;
a protection circuit layer separated from the packaging circuit layer by an insulation material, wherein the protection circuit layer extends along a sidewall of the electronic device;
a solder mask layer overlying a portion of the protection circuit layer and along the sidewall of the electronic device;
at least a first connection electrically connected to the protection circuit layer and serving as a soldering point for EMI grounding; and
at least a second connection electrically connected to the packaging circuit layer.

22. The electronic device packaging as claimed in claim 21, wherein a portion of the protection circuit layer along the sidewall of the electronic device is not covered by the solder mask layer.

23. The electronic device packaging as claimed in claim 22, further comprising a conductive layer overlying a portion of the solder mask layer.

24. The electronic device packaging as claimed in claim 23, wherein the conductive layer extends to cover a portion of the protection circuit layer overlying the sidewall of the electronic device.

25. The electronic device packaging as claimed in claim 24, wherein at least one of the first conductive layer and the second conductive layer is a metalized layer.

* * * * *